United States Patent
Bogner

(10) Patent No.: US 9,584,150 B2
(45) Date of Patent: Feb. 28, 2017

(54) GAIN CALIBRATION FOR ADC WITH EXTERNAL REFERENCE

(71) Applicant: Infineon Technologies AG, Neubiberg (DE)

(72) Inventor: Peter Bogner, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/793,118

(22) Filed: Jul. 7, 2015

(65) Prior Publication Data

US 2017/0012639 A1    Jan. 12, 2017

(51) Int. Cl.
*H03M 1/10* (2006.01)
*H03M 1/46* (2006.01)

(52) U.S. Cl.
CPC ......... *H03M 1/468* (2013.01); *H03M 1/1009* (2013.01)

(58) Field of Classification Search
CPC .... H03M 1/468; H03M 1/804; H03M 1/1057; H03M 1/68; H03M 1/1061; H03M 1/403; H03M 1/1009; H03M 1/10; H03M 1/1071; H03M 1/46; H03M 1/442; H03M 1/00; H03M 1/12; H03M 1/745; H03M 1/80
USPC .................. 341/118, 120, 155, 172
See application file for complete search history.

(56) References Cited

U.S. PATENT DOCUMENTS

| | | | |
|---|---|---|---|
| 5,825,316 A | 10/1998 | Kuttner | |
| 7,170,439 B1* | 1/2007 | Chen ................... | H03M 1/1009 341/118 |
| 8,547,270 B1 | 10/2013 | Strode | |
| 8,665,125 B2* | 3/2014 | Reinhold ............ | H03M 1/1061 341/120 |
| 8,766,833 B1* | 7/2014 | Bogner ............... | H03M 1/1014 341/118 |
| 9,136,857 B2 | 9/2015 | Bogner et al. | |
| 2011/0122006 A1* | 5/2011 | Liao .................... | H03M 1/1047 341/120 |
| 2011/0215956 A1* | 9/2011 | Ishikawa ................. | H03M 1/00 341/110 |
| 2012/0001781 A1* | 1/2012 | Scanlan .............. | H03M 1/1004 341/110 |
| 2012/0182166 A1 | 7/2012 | Haneda et al. | |
| 2013/0076546 A1* | 3/2013 | Wan ..................... | H03M 1/1033 341/120 |
| 2014/0077979 A1 | 3/2014 | Miki et al. | |
| 2015/0002321 A1* | 1/2015 | Zhou ................... | H03M 1/0617 341/118 |

FOREIGN PATENT DOCUMENTS

DE    19512495 C1    8/1996

OTHER PUBLICATIONS

International Search Report and Written Opinion of International Application No. PCT/EP20161001159, mailed Sep. 30, 2016, 14 pp.

* cited by examiner

*Primary Examiner* — Linh Nguyen

(74) *Attorney, Agent, or Firm* — Shumaker & Sieffert, P.A.

(57) ABSTRACT

Representative implementations of devices and techniques provide gain calibration for analog to digital conversion of time-discrete analog inputs. An adjustable capacitance arrangement is used to reduce or eliminate gain error caused by capacitor mismatch within the ADC. For example, the capacitance arrangement may include an array of multiple switched capacitances arranged to track gain error during search algorithm operation.

29 Claims, 6 Drawing Sheets

GAIN CALIBRATION FOR ADC WITH EXTERNAL REFERENCE

BACKGROUND

Analog-to-digital converters (ADCs) convert time-discrete analog input values to a digital form. A type of ADC, the successive approximation register (SAR) ADC, digitizes the analog input values using a successive approximation search algorithm. While the internal circuitry of the SAR ADC may run at a higher frequency (such as several megahertz (MHz), for example), the sample rate of the SAR ADC is generally a fraction of that frequency (such as several kilohertz (kHz), for example) due to the successive approximation search algorithm used. For example, normally each bit of the SAR ADC is fully realized prior to proceeding on to the next bit.

In general, many of today's microcontroller products can have several SAR ADCs on a single chip. In some high-end products, up to 20 or more ADC instances may be placed on the chip. To reduce the amount of ADC instances, a passive sample and hold (SH) ADC structure can be used with a time multiplexed operating scheme.

In some cases, an external voltage reference may be provided to the ADC. This external reference can be a direct supply to the ADC and also a supply to the sensors of the application, for instance. In such an application, the output of the sensors can be a ratiometric voltage based on the supply, which is converted by the ADC to a digital form for use by the microcontroller. The absolute value of the reference/supply voltage is generally cancelled in this scheme, making the external ADC reference desirable. In another implementation, the voltage reference may be provided by the ADC.

However, gain error can occur within passive SH ADCs, due to the use of two different capacitors: one for analog input sampling and one for the conversion process (internal digital-to-analog conversion). The gain error is associated with a mismatch of these two capacitors. In some cases, an on-chip reference voltage can provide at least a partial remedy for the gain error. Generally though, an on chip reference uses a reference buffer for the switched capacitor load of the ADC. This buffer uses chip area and current, and can produce noise. Further, the use of an on-chip reference disallows many of the benefits of an external reference, including those mentioned above.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

DETAILED DESCRIPTION

Overview

Figure 1:
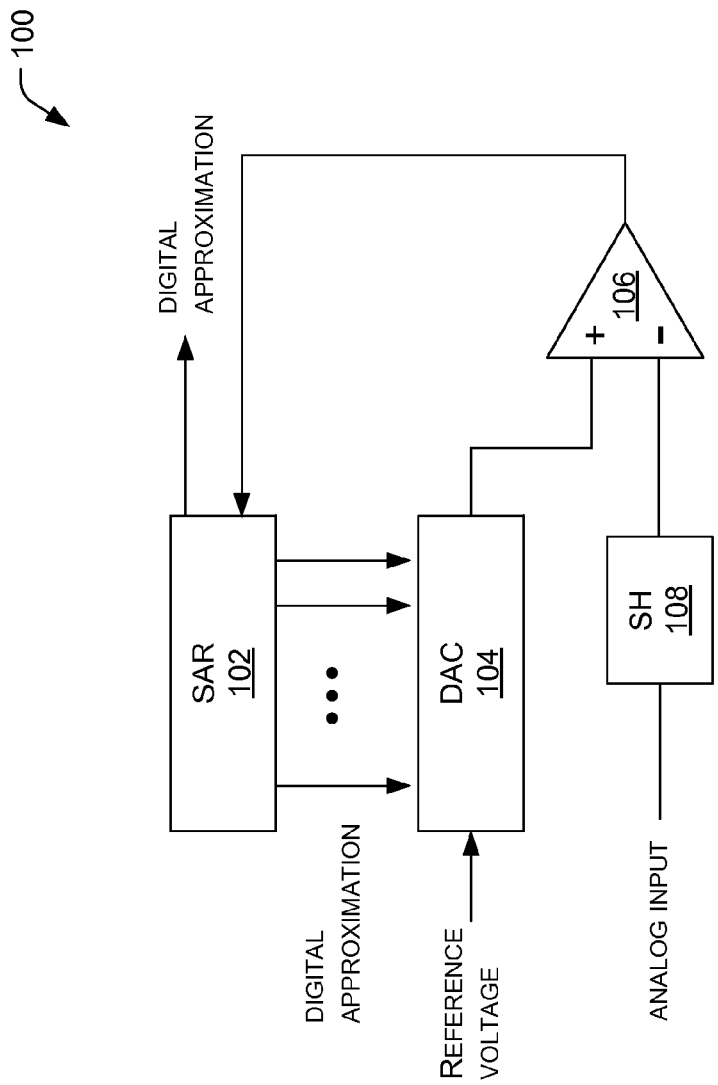
FIG. 1 is a schematic diagram of an example analog-to-digital converter (ADC) wherein the techniques and devices described herein may be applied.

Representative implementations of devices and techniques provide gain calibration for a passive sample and hold (SH) analog-to-digital converter (ADC) using an external voltage reference (e.g., the voltage reference is sourced off-chip rather than produced on the chip). In an implementation, an adjustable capacitance arrangement (e.g., a calibration capacitance) is used to reduce or eliminate gain error caused by capacitor mismatch within the ADC. In the implementation, the calibration capacitance is dynamically adjusted such that the sum of the digital-to-analog (DAC) capacitance and the calibration capacitance is equal to the SH capacitance that samples the analog input signal at the input of the ADC.

In one example, the calibration capacitance arrangement may include an array of multiple switched capacitances arranged to track the gain error during a search algorithm operation by the successive approximation register (SAR). For instance, the search algorithm operation can cause the capacitors of the DAC capacitance to switch to and from the reference voltage, causing a dynamic gain error created by capacitor mismatch. In an implementation, information regarding the DAC capacitance switching is communicated to the calibration capacitance, allowing the calibration capacitance to dynamically track the gain error. In the implementation, the calibration capacitance is dynamically adjusted based on the portion of the DAC capacitance (e.g., the number of array capacitors) that is coupled to the reference voltage at a given instant.

In other implementations, the ADC includes calibration logic (e.g., a calibration logic module, etc.) arranged to adjust the calibration capacitance based on information received from the SAR and/or from other calibration components, such as an up-down counter, or the like. In one example, the calibration logic scales the calibration capacitance as needed to provide fine gain error correction.

Various implementations and techniques for gain calibration of ADC arrangements are discussed in this disclosure. Techniques and devices are discussed with reference to example analog-to-digital converter (ADC) devices and systems illustrated in the figures. In some cases, successive-approximation ADC (SAR ADC) designs are shown and discussed. However, this is not intended to be limiting, and is for ease of discussion and illustrative convenience. The techniques and devices discussed may be applied to many of various ADC device designs, structures, combinations, and the like (e.g., direct-conversion ADC, flash ADC, rampcompare ADC, integrating ADC (also referred to as dual-slope or multi-slope ADC), counter-ramp ADC, pipeline ADC, sigma-delta ADC, time interleaved ADC, intermediate FM stage ADC, etc.), and remain within the scope of the disclosure.

Implementations are explained in more detail below using a plurality of examples. Although various implementations and examples are discussed here and below, further implementations and examples may be possible by combining the features and elements of individual implementations and examples.

Example ADC Arrangement

FIG. 1 is a schematic diagram of an example analog-to-digital conversion (ADC) arrangement 100, wherein the techniques and devices described herein may be applied. Analog signals ("analog input") are received on the input side, converted by a quantity of ADC components, and digital results ("digital output," "digital approximation," or "digital representation") are output from the ADC 100.

For the purposes of this disclosure, a digital result may be described as a digital approximation of an analog input. For example, a digital result may include a digital representation that is proportional to the magnitude of the voltage or current of the analog input, at a point in time and/or over a selected duration. The digital representation may be expressed in various ways (e.g., base 2 binary code, binary coded decimal, voltage values, electrical or light pulse attributes, and the like).

As shown in FIG. 1, an example ADC 100 may include a successive approximation register (SAR) component 102, a digital-to-analog converter (DAC) 104, and a comparator 106. In alternate implementations, an example ADC 100 may include fewer, additional, or alternate components.

The SAR 102 receives the analog input signal (which may be adjusted based on the output of the DAC 104 via the comparator 106) and determines a digital approximation for the analog input signal. The SAR 102 may output the digital results in a parallel fashion (such as illustrated to the DAC 104), with each bit (of multiple bits based on the resolution of the SAR 102) outputted on an individual path. Also, the SAR 102 may output the digital results in a serial form. Both of these techniques are shown in the illustration of FIG. 1. In various implementations, the output of the SAR 102 is the digital output of the ADC 100.

Resolution of the ADC 100 may be defined based on the minimum voltage level required to cause a change in the output code of the SAR 102. For example, the minimum voltage that causes a change in the digital code is the least significant bit (LSB) of the ADC 100. The resolution of the ADC 100 is the LSB voltage. In various implementations, the SAR 102 may have 8, 10, or 12 bits of resolution, for example. In alternate implementations, the SAR 102 may have fewer or a greater number of bits of resolution.

Configurations and/or arrangements for the SAR 102 and/or the DAC 104 may vary, and are discussed further below. Additionally, approximating a digital value for each input signal (and/or converting the digital signal to an analog form within the DAC) may be according to one or more processes or algorithms.

In an example, the DAC 104 receives a digital output of the SAR 102, and converts it to an analog form. As shown in FIG. 1, the DAC 104 can receive the digital output of the SAR 102 via multiple bits, based on the resolution of the SAR 102. Also as shown in FIG. 1, the analog form of the digital output may be fed back, and/or combined with or compared to the analog input signal (e.g., added, subtracted, etc.). The feedback loop of the DAC 104 can provide error correction to the ADC 100, as the analog form of the digital output is compared to the analog input signal, the reference voltage, or another signal.

Additionally, the ADC 100 may include one or more sample and hold components (SH) 108. However, it should be understood the ADC 100 may be implemented and function without the use of the SH 108. For example, the SH 108 may include a capacitance, one or more capacitances in an array, or the like. The SH 108 can sample the analog input continuously, at predefined discrete moments, or at other desired durations or intervals. The sampled input is digitally approximated using the SAR 102, and is also compared to the analog output of the DAC 104 to maintain an accurate ADC 100 output. In some implementations, one or more capacitances of the SAR 102 may also act as SH components.

In alternate implementations, an ADC 100 may include additional components or alternate components to perform the functions discussed, or for other desired functionality. In further implementations, the functional components or modules of the ADC 100 may be arranged or combined in a different arrangement, form, or configuration.

Figure 2:
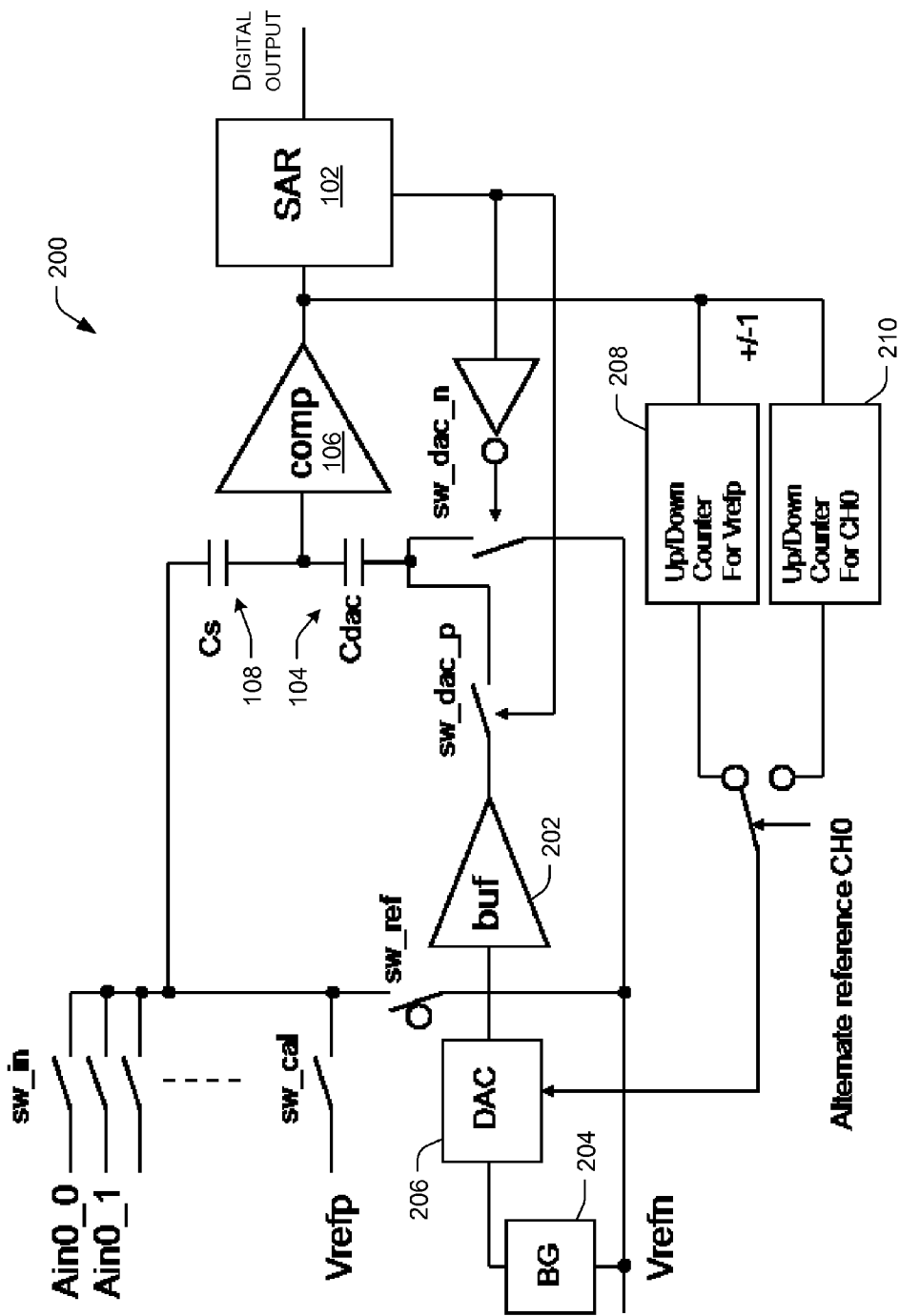
FIG. 2 is a schematic diagram of an example analog-to-digital converter (ADC) arrangement, including an on-chip reference voltage.

For example, FIG. 2 illustrates an example of an alternate arrangement of a SAR ADC 100, shown as ADC 200. The ADC 200 shown in FIG. 2 includes one or more switched capacitances (Cdac) functioning as a DAC 104, and one or more sampling capacitances (Cs) functioning as a SH 108. Further, the ADC 200 of FIG. 2 includes one or more on-chip voltage references (Vrefn and Vrefp). In some cases, one of the voltage references (Vrefn, for instance) may be at a ground or negative potential.

As shown in FIG. 2, the ADC 200 includes a reference buffer 202 for the switched capacitor loads Cdac 104 and DAC 206. As mentioned above, the buffer 202 uses chip area, uses current, and can produce undesirable noise. In the example, the ADC 200 also includes a biasing component 204, the additional DAC 206, and up-down counters 208 and 210 to compensate for the on-chip reference(s) (Vrefn and Vrefp).

Example Implementations

Figure 3:
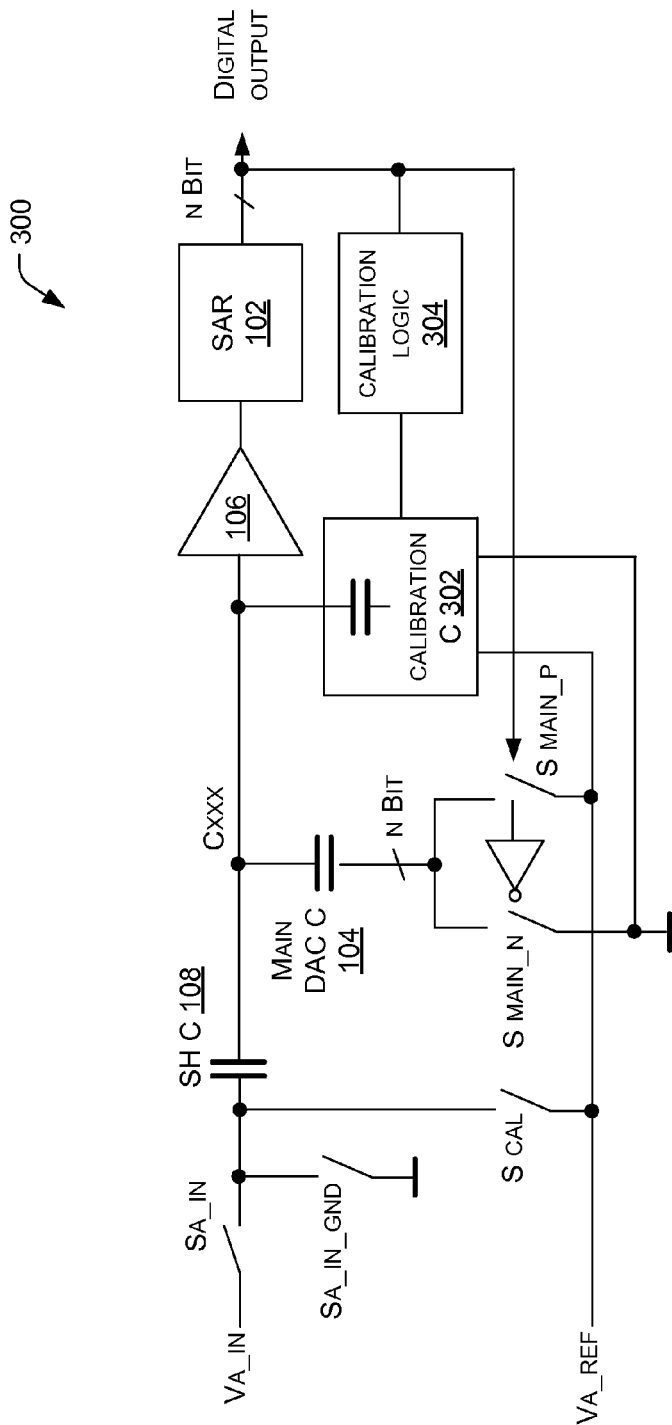
FIG. 3 is a schematic diagram of an example analog-to-digital converter (ADC) arrangement, with an external reference and calibration capacitance, according to an implementation.

In an implementation, an ADC 100 can be arranged with an external voltage reference, as mentioned above. For example, FIG. 3 is a schematic diagram of an example ADC 300 having an external voltage reference "Va_ref," according to an implementation. In other words, the reference Va_ref is generated off-chip and is transmitted to the ADC 300.

As shown in FIG. 3, the ADC 300 is a passive sample and hold SAR ADC 100. For example, the ADC 300 includes a passive sample and hold capacitance (SH C) 108 arranged to receive an analog input voltage "Sa_in" and a digital-to-analog converter capacitance (DAC C) 104 coupled to SH C 108 at a first node Cxxx. In another implementation, the SH C 108 is omitted.

In an implementation, as shown in FIG. 3, no buffer 202 is used with the ADC 300, based on the use of an external reference Va_ref. However, in some applications, the external reference Va_ref may not be easily trimmed to correct the gain error induced by the capacitors DAC C 104 and/or SH C 108. Accordingly, a calibration capacitance (CAL C) 302 can be employed for this purpose, as discussed further below. In another implementation, the CAL C 302 is provided to compensate for second order errors, such as errors associated with dielectric absorption. Second order errors are often seen in implementations that do not employ the use of the SH C 108 (i.e., when errors are caused by the DAC C 104).

As shown, the DAC C 104 is switchably coupled to the external reference voltage Va_ref, via one or more switches (e.g., S_main_n, S_main_p). In an implementation, the maximum voltage of the analog input voltage Va_in is the reference voltage Va_ref. In the implementation, this means that both voltages can be provided from the external source supplying the reference voltage Va_ref.

In an implementation, the ADC 300 includes a comparator 106 coupled at the node Cxxx, and a successive approximation register (SAR) 102 coupled to an output of the comparator 106, forming an ADC without using an additional reference. In the example, the output of the SAR 102 comprises a digital output of the ADC 300.

In an implementation, the DAC C 104 comprises an array of multiple switched capacitances. In one example, the DAC C 104 array consists of n capacitances. For instance, if a binary-weighted DAC C 104 is used (such as shown in FIG. 3), n is equal to the resolution of the ADC 300 in bits. In other words, each of the capacitances of an array can represent a bit position. In alternate implementations, one or more of the capacitances of the array may be implemented using a single component or multiple sub-elements.

For a non-binary-weighted DAC 104 (also within the scope of the disclosure), n may be bigger than the bit-resolution of the ADC 300. In an implementation, coding logic may be used between the SAR 102 and the digital output, to conform the output to an application.

The switches (e.g., S_main_n, S_main_p) at the bottom of the DAC C 104 connect the individual capacitances of the DAC C 104 array to the external reference Va_ref or to the negative reference (drawn as a ground in FIG. 3, however other ground potential or negative reference values are also within the scope of the disclosure). In an implementation, the switches (e.g., S_main_n, S_main_p) of the DAC C 104 are switched during the search algorithm of the SAR 102. If the sampling capacitance SH C 108 and the sum of the DAC C 104 capacitances are equal, the ADC 300 will deliver an accurate result without gain error. If these two capacitances do not have the same capacitance value, a gain error will likely be visible in the result. In some implementations, the switches (e.g., S_main_n, S_main_p) may be implemented with fast switching transistors, such as MOSFETS, or the like.

In an implementation, as shown in FIG. 3, the ADC 300 includes a calibration capacitance CAL C 302. Using the CAL C 302, the deviation of capacitances, DAC C 104 and/or SH C 108, can be equalized. In an implementation, the calibration capacitance CAL C 302 is adjustable to minimize a difference between a capacitance value of the SH C 108 and a capacitance value comprising a sum of the CAL C 302 and the DAC C 104, to reduce or eliminate gain error of the ADC 300.

For example, to achieve a desired gain correction, the sum of the DAC C 104 and the applied CAL C 302 is adjusted to be equal to the SH C 108. In various implementations, this is performed by adjusting the capacitance value of the CAL C 302. In the implementations, the value of the capacitance of CAL C 302 may be calculated (e.g., using calibration logic 304, etc.) to achieve this goal. This means that in the implementations, SH C 108 has a larger capacitance value than DAC C 104 and CAL C 302, and that the capacitance value of CAL C 302 is larger than the difference between the capacitance values of SH C 108 and DAC C 104.

In an implementation, the ADC 300 includes a calibration logic module 304 arranged to receive the output of the SAR 102 and to adjust the calibration capacitance CAL C 302. In an example, the CAL C 302 is adjusted based on how many of the multiple capacitances comprising the DAC C 104 are switched to the reference voltage Va_ref. In other words, the CAL C 302 is adjusted or scaled by the calibration logic 304, based on information regarding DAC C 104 switching. Thus, in an implementation, the switch settings of the DAC C 104 are provided to the calibration logic 304.

For example, in an implementation, if all capacitances of the DAC C 104 are coupled (i.e., switched) to the reference voltage Va_ref (i.e., full scale of the ADC 300), the entire capacitance value of the CAL C 302 is applied. In the implementation, if one half of the capacitances of the DAC C 104 are coupled (i.e., switched) to the reference voltage Va_ref (i.e., half scale of the ADC 300), then one half capacitance of the CAL C 302 is applied, and so forth.

In an implementation, the calibration capacitance CAL C 302 comprises an array of multiple switched capacitances having a total capacitance value that is greater than a difference between a capacitance value of the SH C 108 and a capacitance value of the DAC C 104. In the implementation, the CAL C 302 is adjusted by switching in or out (e.g., to or from the reference voltage Va_ref and thus to or from the negative reference or ground) one or more of the multiple switched capacitances of the array of CAL C 302. In the implementation, the CAL C 302 is adjusted based on the switching of the capacitances of the array of the DAC C 104. Thus the CAL C 302 is arranged to "track" the DAC C 104 to reduce or eliminate a deviation between a capacitance value of the DAC C 104 and/or a capacitance value of the SH C 108. This tracking allows for the mitigation of gain and/or second order error(s).

Figure 4:
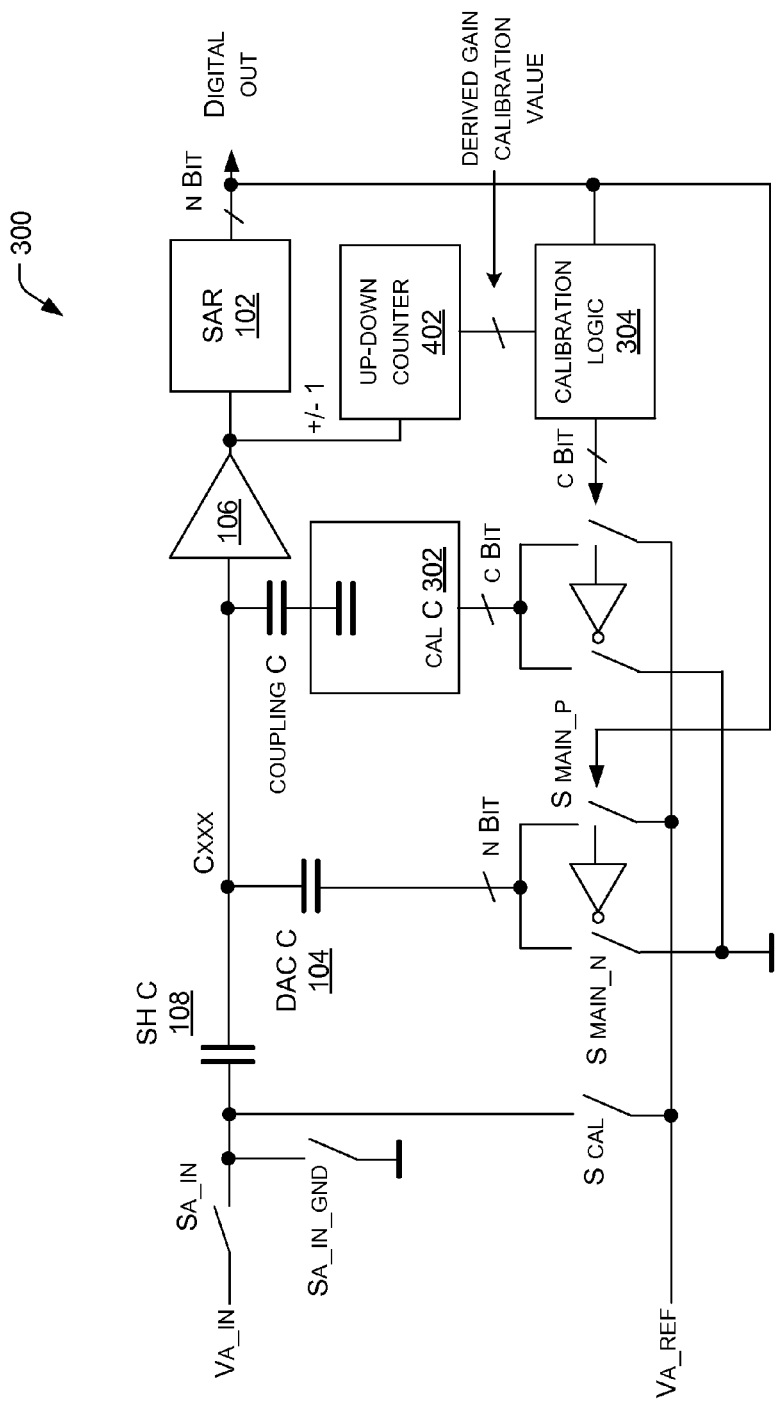
FIG. 4 is a schematic diagram of an example analog-to-digital converter (ADC) arrangement, with an external reference and calibration capacitance, according to another implementation.

FIG. 4 is a schematic diagram of an example ADC 300, with an external reference Va_ref and a calibration capacitance CAL C 302, according to another example. In an implementation, as shown in FIG. 4, the ADC 300 includes a coupling capacitor coupled between the CAL C 302 and the node Cxxx. In one example, the coupling capacitor is arranged to scale the CAL C 302 down with respect to the DAC C 104, if desired. For instance, this allows for a single calibration capacitance array (i.e., the CAL C 302) for the ADC 300. In one example, the CAL C 302 has a calibration capacitance weight in the sub-LSB range, for example, based on the coupling capacitor. Further, this allows for a single (e.g., external) voltage reference for the whole ADC 300. In another implementation (not shown), a single capacitance array is used as the SH C 108 and the DAC C 104.

In an implementation, as shown in FIG. 4, the ADC 300 includes an up-down counter 402 arranged to derive a gain calibration value used by the calibration logic module 304 to adjust the CAL C 302. In the implementation, the up-down counter 402 is increased or decreased after a calibration step, tracking a gain error of the ADC 300 based on a difference in capacitance values of the SH C 108 and the DAC C 104. In the implementation, the output of the up-down counter 402 triggers a switching of one or more capacitances of the CAL C 302 to or from the reference voltage Va_ref, based on a switching of one or more capacitances of the DAC C 104 to or from the reference voltage Va_ref.

In an implementation, the gain calibration value derived by the up-down counter is dynamic, tracking the gain error based on the capacitance values of the SH C 108 and the DAC C 104, as the DAC C 104 dynamically switches during the SAR 102 search routine. In the implementation, the derived gain calibration value is fed to the calibration logic 304 to set the CAL C 302 to a calibration capacitance value based on the amount of capacitance coupled (e.g., switched) to the reference voltage Va_ref by the DAC C 104.

In an implementation, the value of the gain calibration value is derived via a calibration routine, for instance, either in a startup or in a post calibration phase. In this phase the SH C 108 is connected to Va_ref via switch Scal, and the node Cxxx is connected internally to a bias voltage (responsible switch not shown). The DAC C 104 is connected to ground. After the sampling phase, Cxxx is set to a high impedance state and both capacitances (SH C 108 and DAC C 104) are disconnected from Va_ref and gnd respectively, i.e., these switches are opened.

During the compare phase, the SH C 108 is grounded via Sa_in gnd and the DAC C 104 is switched to Va_ref. The SH C 108 injects a negative voltage on the high impedance node Cxxx and the DAC C 104 injects a positive voltage on the node Cxxx. If both injections are equal (meaning the capacitances SH C 108 and DAC C 104 are equal), the comparator 106 will see no voltage deviation on its input, and is placed on its trip point. If a difference between the injections is present, the comparator 106 detects the sign of the difference and the calibration logic 304 can cause capacitance to be added or subtracted from the CAL C 302 to guide the comparator 106 to its trip point. In an implementation, putting the comparator 106 at its trip point is the calibration goal, which can be reached by executing this routine several times, if needed.

This calibration technique can also be applied to a standard SAR ADC where only one capacitor is used for both sampling and conversion. This scheme typically has an ideal gain of 1, but may not in a practical application, for example, with leakage or the like. In an implementation, the CAL C 302 can be used in an identical way to overcome a gain error due to leakage.

In another implementation (see FIG. 5), the ADC 300 includes an arithmetic unit arranged to calculate a final calibration value used by the calibration logic module 304 to adjust the CAL C 302. In the implementation, the final calibration value comprises the gain calibration value and a derived linearity calibration value.

For example, in various implementations, a linearity error can be present in the DAC C 104, resulting from a mismatch between the multiple DAC C 104 capacitances. This generally means that the MSB-1 capacitor does not exactly equal one half of the MSB capacitor, and so forth. A linearity error is the result, which can also be compensated by the calibration capacitance CAL C 302.

In an implementation, the CAL C 302 is arranged to reduce or eliminate a gain error and a linearity error of the ADC 300, without the use of a reference buffer (such as buffer 202, for example). In one example, the ADC 300 uses a calibration routine to determine the gain error cancellation weight of the CAL C 302. For instance, the calibration routine can be used to calculate the applied calibration value during a conversion cycle, based on the actual programming (e.g., switching arrangement) of the DAC C 104. In the implementation, the same CAL C 302 is used for gain calibration and also for linearity calibration. Accordingly, the calculated calibration capacitance value is based on correcting for gain error and for linearity error.

Figure 5:
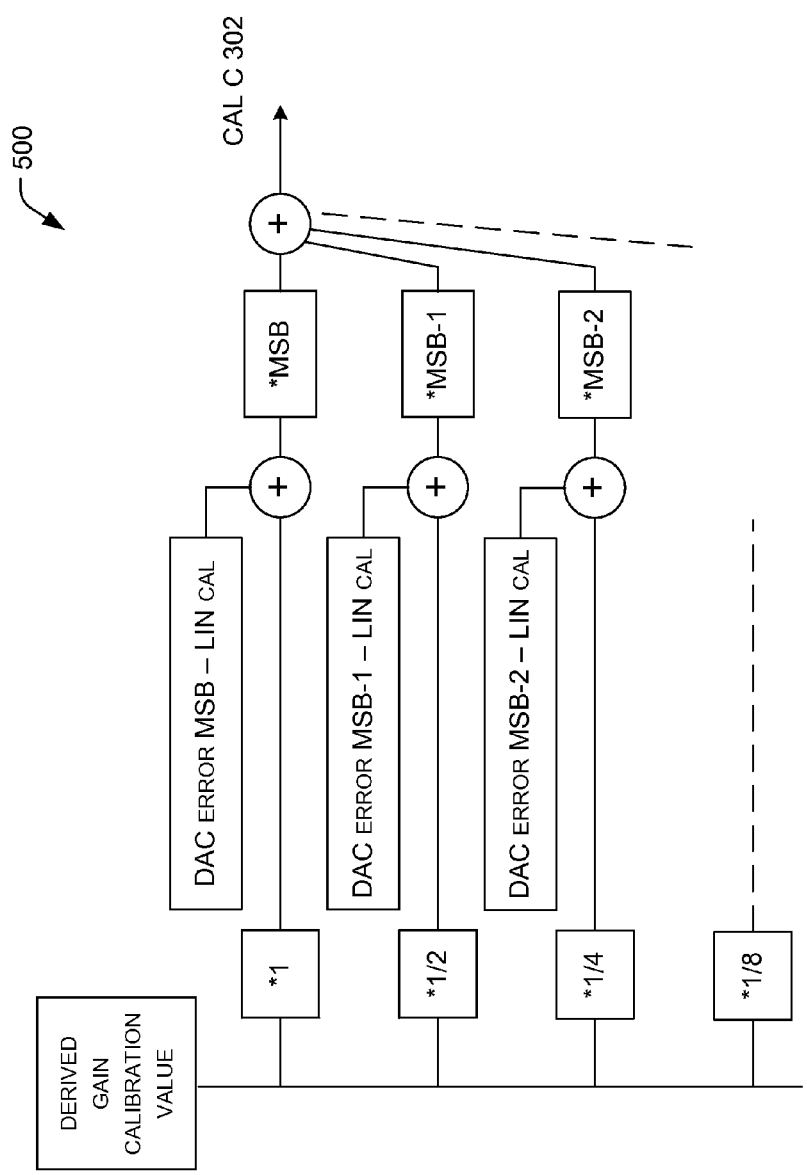
FIG. 5 is a block diagram of an example calibration logic arrangement, according to an implementation.

FIG. 5 is a block diagram of an example calibration logic arrangement 500, which may be implemented using an arithmetic unit, according to an implementation. For example, the arrangement 500 may be used to calculate a final calibration value to be applied to the CAL C 302 to correct for gain error and linearity error.

In an implementation, the linearity calibration value is derived by comparing a capacitance value of an identified capacitance representing an associated bit position with a sum of capacitance values of capacitances representing all lesser bit positions from the associated bit position. For example, the calibration routine can begin with MSB calibration including a comparison of the MSB capacitor of the DAC C 104 with the sum of all other capacitors of the DAC C 104. Then, for calibration of the MSB-1 capacitor, the routine includes a comparison of the MSB-1 capacitor of the DAC C 104 to the rest of the capacitors of the DAC C 104, excluding the MSB capacitor. This routine can be executed for each capacitor of the DAC C 104. The final linearity calibration value can be added to the derived gain calibration value to determine a final derived calibration value that is applied to the CAL C 302.

As discussed above, the techniques, components, and devices described herein with respect to the implementations are not limited to the illustration in FIGS. 1-5, and may be applied to other ADC 100 and 300, SAR 102, and/or DAC 104 devices and designs without departing from the scope of the disclosure. In some cases, additional or alternative components may be used to implement the techniques described herein. Further, the components may be arranged and/or combined in various combinations, while resulting in a digital output. It is to be understood that an ADC 100 and 300, SAR 102, and/or DAC 104 may be implemented as a stand-alone device or as part of another system (e.g., integrated with other components, systems, etc.).

In various implementations, additional or alternative components may be used to accomplish the disclosed techniques and arrangements.

Representative Process

Figure 6:
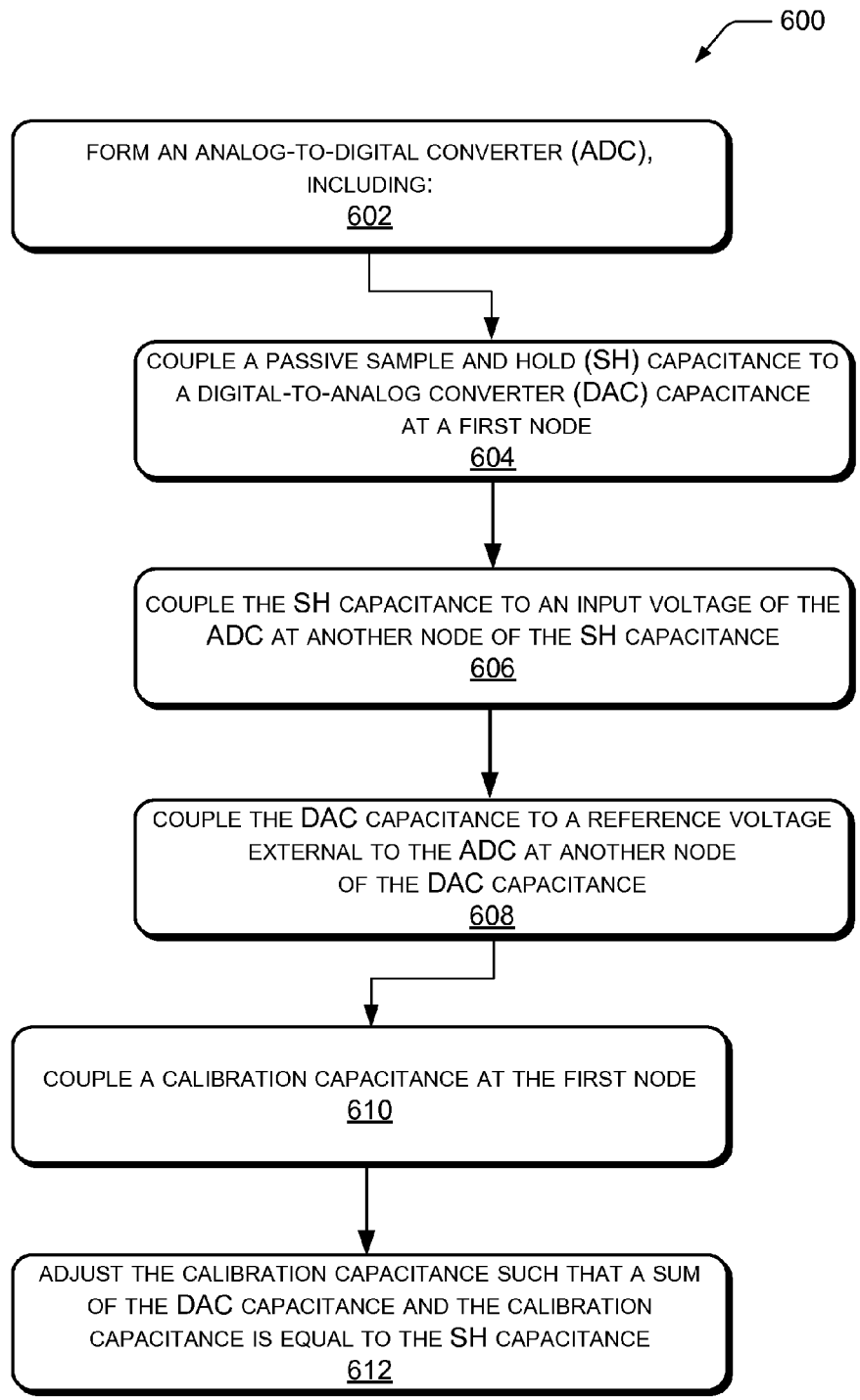
FIG. 6 is a flow diagram illustrating an example process for calibrating an analog-to-digital converter (ADC) using a calibration capacitance arrangement, according to an implementation.

FIG. 6 is a flow diagram illustrating an example process 600 for calibrating gain error of an ADC (such as ADC 300, for example) with an external voltage reference, according to an implementation. The process 600 describes using a calibration capacitance arrangement (such as CAL C 302, for example) to correct for a gain error created by a capacitance deviation between a sample and hold capacitance and a DAC capacitance of the ADC. The same process 600 may be used to provide a calibration capacitance that tracks or substantially matches a DAC capacitance of the ADC. The process 600 is described with reference to FIGS. 1-5.

The order in which the process is described is not intended to be construed as a limitation, and any number of the described process blocks can be combined in any order to implement the process, or alternate processes. Additionally, individual blocks may be deleted from the process without departing from the spirit and scope of the subject matter described herein. Furthermore, the process can be implemented in any suitable materials, or combinations thereof, without departing from the scope of the subject matter described herein.

At block 502, the process includes forming an analog-to-digital converter (ADC) (such as ADC 300, for example), and includes:

At block 504, the process includes, in one implementation, coupling a passive sample and hold (SH) capacitance (such as SH C 108, for example) to a digital-to-analog converter (DAC) capacitance (such as DAC C 104, for example) at a first node (such as node Cxxx, for example). In an implementation, the process includes coupling a comparator (such as comparator 106, for example) to the first node and coupling a successive approximation register (SAR) (such as SAR 102, for example) to an output of the comparator, an output of the SAR comprising a digital output of the ADC.

At block 506, the process includes coupling the SH capacitance to an input voltage of the ADC at another node of the SH capacitance. For example, in an implementation the process includes receiving an analog input voltage at the SH capacitance.

At block 508, the process includes coupling the DAC capacitance to a reference voltage (such as Va_ref, for example) external to the ADC at another node of the DAC capacitance. In an implementation the process includes coupling the DAC capacitance to the reference voltage via one or more switches. Further, the process includes a capability of switchably coupling the DAC capacitance to a ground or other negative reference.

At block 510, the process includes coupling a calibration capacitance (such as CAL C 302, for example) at the first node. At block 512, the process includes adjusting the calibration capacitance such that a sum of the DAC capacitance and the calibration capacitance is equal to the SH capacitance. In an implementation the process includes reducing or eliminating a gain error of the ADC via the adjusting.

In an implementation the process includes dynamically adjusting the calibration capacitance as the DAC capacitance changes. In the implementation, the DAC capacitance and/or the calibration capacitance comprise an array of multiple switched capacitances. In the implementation the process includes dynamically adjusting the calibration capacitance based on a portion of the DAC capacitance that is coupled to the reference voltage at a given instant.

In an implementation the process includes reducing a capacitance of the calibration capacitance by one half when one half of the capacitance of the DAC capacitance is coupled to the reference voltage. In the implementation the process includes reducing a capacitance of the calibration capacitance by three fourths when one fourth of the capacitance of the DAC capacitance is coupled to the reference voltage.

In an implementation the process includes adjusting a scale of the calibration capacitance using calibration logic based on information received from the SAR. In another implementation the process includes adjusting the calibration capacitance to calibrate for linearity error as well as for gain error of the ADC.

In an implementation the process includes determining a gain error cancellation weight (e.g., a derived gain calibration value) using a calibration routine, comprising:
coupling the SH capacitance to the reference voltage at the other node of the SH capacitance;
coupling the first node to a bias voltage;
coupling the DAC capacitance to ground at the other node of the DAC capacitance;
disconnecting the SH capacitance from the reference voltage and the DAC capacitance from ground and setting the first node to a high impedance state after charging the SH capacitance with the reference voltage;
coupling the SH capacitance to ground at the other node of the SH capacitance; coupling the DAC capacitance to the reference voltage at the other node of the DAC capacitance;
comparing an injected voltage from the SH capacitance to an injected voltage from the DAC capacitance at the first node;
placing a comparator coupled to the first node on a trip point of the comparator when the injected voltage from the SH capacitance and the injected voltage from the DAC capacitance are equal; and detecting a sign of a voltage magnitude deviation between the injected voltage from the SH capacitance and the injected voltage from the DAC capacitance, and adding or subtracting a capacitance from the calibration capacitance when the injected voltage from the SH capacitance and the injected voltage from the DAC capacitance are not equal.

In an implementation the process includes executing the calibration routine one or more times, until the comparator is placed on the trip point of the comparator.

In alternate implementations, other techniques may be included in the process 1000 in various combinations, and remain within the scope of the disclosure.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

What is claimed is:

1. An analog-to-digital converter (ADC), comprising:
a passive sample and hold (SH) capacitance arranged to receive an analog input voltage;
a digital-to-analog converter (DAC) capacitance coupled to the SH capacitance at a first node and switchably coupled to a reference voltage at another node of the DAC capacitor;
a calibration capacitance coupled at the first node, the calibration capacitance adjustable to minimize a difference between a capacitance value of the SH capacitance and a capacitance value comprising a sum of the calibration capacitance and the DAC capacitance; and
a calibration logic controller configured to:
couple the SH capacitance to the reference voltage at another node of the SH capacitance;
couple the first node to a bias voltage;
couple the DAC capacitance to ground at the other node of the DAC capacitance;
disconnect the SH capacitance from the reference voltage and the DAC capacitance from ground and setting the first node to a high impedance state after charging the SH capacitance with the reference voltage;
couple the SH capacitance to ground at the other node of the SH capacitance;
couple the DAC capacitance to the reference voltage at the other node of the DAC capacitance;
compare an injected voltage from the SH capacitance to an injected voltage from the DAC capacitance at the first node;
place a comparator coupled to the first node on a trip point of the comparator when the injected voltage from the SH capacitance and the injected voltage from the DAC capacitance are equal; and
detect a sign of a voltage magnitude deviation between the injected voltage from the SH capacitance and the injected voltage from the DAC capacitance, and add or subtract a capacitance from the calibration capacitance when the injected voltage from the SH capacitance and the injected voltage from the DAC capacitance are not equal.

2. The ADC of claim 1, wherein the comparator is coupled at the first node and a successive approximation register (SAR) coupled to an output of the comparator, an output of the SAR comprising a digital output of the ADC.

3. The ADC of claim 2, wherein the DAC capacitance comprises an array of multiple switched capacitances, the ADC further comprising a calibration logic module arranged to receive the output of the SAR and to adjust the calibration capacitance based on how many of the multiple capacitances of the DAC capacitance are switched to the reference voltage.

4. The ADC of claim 1, wherein the calibration capacitance is arranged to track the DAC capacitance and to reduce or eliminate a deviation between a capacitance value of the DAC capacitance and a capacitance value of the SH capacitance.

5. The ADC of claim 1, wherein the ADC does not implement a buffer.

6. The ADC of claim 1, wherein the calibration capacitance is arranged to reduce or eliminate a gain error and a linear error of the ADC.

7. The ADC of claim 1, wherein the calibration capacitance comprises an array of multiple capacitances having a total capacitance value that is greater than a difference between a capacitance value of the SH capacitance and a capacitance value of the DAC capacitance.

8. The ADC of claim 1, wherein a single capacitance array is used as the SH capacitance and the DAC capacitance.

9. An analog-to-digital converter (ADC), comprising:
a passive sample and hold (SH) capacitance arranged to receive an analog input voltage;
a digital-to-analog converter (DAC) capacitance comprising an array of multiple switched capacitances, coupled to the SH capacitance at a first node and switchably coupled to a reference voltage at another node of the DAC;
a comparator coupled at the first node at an input of the comparator;
a successive approximation register (SAR) coupled to an output of the comparator, an output of the SAR comprising a digital output of the ADC;
a calibration capacitance coupled at the first node, the calibration capacitance adjustable to minimize a difference between a capacitance value of the SH capacitance and a capacitance value comprising a sum of the calibration capacitance and the DAC capacitance; and
a calibration logic module configured to:
couple the SH capacitance to the reference voltage at another node of the SH capacitance;
couple the first node to a bias voltage;
couple the DAC capacitance to ground at the other node of the DAC capacitance;
disconnect the SH capacitance from the reference voltage and the DAC capacitance from ground and setting the first node to a high impedance state after charging the SH capacitance with the reference voltage;
couple the SH capacitance to ground at the other node of the SH capacitance;
couple the DAC capacitance to the reference voltage at the other node of the DAC capacitance;
compare an injected voltage from the SH capacitance to an injected voltage from the DAC capacitance at the first node;
place the comparator coupled to the first node on a trip point of the comparator when the injected voltage from the SH capacitance and the injected voltage from the DAC capacitance are equal; and
detect a sign of a voltage magnitude deviation between the injected voltage from the SH capacitance and the injected voltage from the DAC capacitance, and add or subtract a capacitance from the calibration capacitance when the injected voltage from the SH capacitance and the injected voltage from the DAC capacitance are not equal.

10. The ADC of claim 9, further comprising an up-down counter arranged to derive a gain calibration value used by the calibration logic module to adjust the calibration capacitance.

11. The ADC of claim 10, wherein the up-down counter is increased or decreased after a calibration step, tracking a gain error of the ADC based on a difference in capacitance values of the SH capacitance and the DAC capacitance.

12. The ADC of claim 10, wherein the calibration capacitance comprises an array of multiple switched capacitances, and wherein an output of the up-down counter triggers a switching of one or more capacitances of the calibration capacitance to or from the reference voltage, based on a switching of one or more capacitances of the DAC capacitance to or from the reference voltage.

13. The ADC of claim 10, further comprising an arithmetic unit arranged to calculate a final calibration value used by the calibration logic module to adjust the calibration capacitance, the final calibration value comprising the gain calibration value and a derived linearity calibration value.

14. The ADC of claim 13, wherein the linearity calibration value is derived by comparing a capacitance value of an identified capacitance representing an associated bit position with a sum of capacitance values of capacitances representing all lesser bit positions from the associated bit position.

15. The ADC of claim 9, further comprising a coupling capacitor coupled between the calibration capacitance and the first node and arranged to scale the calibration capacitance down with respect to the DAC capacitance.

16. A method, comprising:
forming an analog-to-digital converter (ADC), including:
coupling a passive sample and hold (SH) capacitance to a digital-to-analog converter (DAC) capacitance at a first node;
coupling the SH capacitance to an input voltage of the ADC at another node of the SH capacitance; and
coupling the DAC capacitance to a reference voltage at another node of the DAC capacitance;
coupling a calibration capacitance at the first node;
comparing an injected voltage from the SH capacitance to an injected voltage from the DAC capacitance at the first node; and
adjusting the calibration capacitance such that a sum of the DAC capacitance and the calibration capacitance is equal to the SH capacitance; and
determining a gain error cancellation weight using a calibration routine, comprising:
coupling the SH capacitance to the reference voltage at the other node of the SH capacitance;
coupling the first node to a bias voltage;
coupling the DAC capacitance to ground at the other node of the DAC capacitance;
disconnecting the SH capacitance from the reference voltage and the DAC capacitance from ground and setting the first node to a high impedance state after charging the SH capacitance with the reference voltage;
coupling the SH capacitance to ground at the other node of the SH capacitance;

coupling the DAC capacitance to the reference voltage at the other node of the DAC capacitance;

comparing an injected voltage from the SH capacitance to an injected voltage from the DAC capacitance at the first node;

placing a comparator coupled to the first node on a trip point of the comparator when the injected voltage from the SH capacitance and the injected voltage from the DAC capacitance are equal; and detecting a sign of a voltage magnitude deviation between the injected voltage from the SH capacitance and the injected voltage from the DAC capacitance, and adding or subtracting a capacitance from the calibration capacitance when the injected voltage from the SH capacitance and the injected voltage from the DAC capacitance are not equal.

17. The method of claim 16, further comprising reducing or eliminating a gain error of the ADC via the adjusting.

18. The method of claim 16, further comprising dynamically adjusting the calibration capacitance as the DAC capacitance changes, the DAC capacitance and/or the calibration capacitance comprising an array of multiple switched capacitances.

19. The method of claim 16, further comprising dynamically adjusting the calibration capacitance based on a portion of the DAC capacitance that is coupled to the reference voltage at a given instant.

20. The method of claim 16, further comprising reducing a capacitance of the calibration capacitance by one half when one half of the capacitance of the DAC capacitance is coupled to the reference voltage.

21. The method of claim 16, further comprising reducing a capacitance of the calibration capacitance by three fourths when one fourth of the capacitance of the DAC capacitance is coupled to the reference voltage.

22. The method of claim 16, further comprising coupling a comparator to the first node and coupling a successive approximation register (SAR) to an output of the comparator, an output of the SAR comprising a digital output of the ADC.

23. The method of claim 22, further comprising adjusting a scale of the calibration capacitance using calibration logic based on information received from the SAR.

24. The method of claim 16, further comprising adjusting the calibration capacitance to calibrate for linearity error as well as for gain error of the ADC.

25. The method of claim 16, further comprising executing the calibration routine one or more times, until the comparator is placed on the trip point of the comparator.

26. An analog-to-digital converter (ADC), comprising:
a passive sample and hold (SH) capacitance arranged to receive an analog input voltage;
a digital-to-analog converter (DAC) capacitance coupled to the SH capacitance at a first node and switchably coupled to a reference voltage at another node of the DAC;
a calibration capacitance coupled at the first node, the calibration capacitance adjustable to track the DAC capacitance; and
a calibration logic module configured to:
couple the SH capacitance to the reference voltage at another node of the SH capacitance;
couple the first node to a bias voltage;
couple the DAC capacitance to ground at the other node of the DAC capacitance;
disconnect the SH capacitance from the reference voltage and the DAC capacitance from ground and setting the first node to a high impedance state after charging the SH capacitance with the reference voltage;
couple the SH capacitance to ground at the other node of the SH capacitance;
couple the DAC capacitance to the reference voltage at the other node of the DAC capacitance;
compare an injected voltage from the SH capacitance to an injected voltage from the DAC capacitance at the first node;
place a comparator coupled to the first node on a trip point of the comparator when the injected voltage from the SH capacitance and the injected voltage from the DAC capacitance are equal; and
detect a sign of a voltage magnitude deviation between the injected voltage from the SH capacitance and the injected voltage from the DAC capacitance, and add or subtract a capacitance from the calibration capacitance when the injected voltage from the SH capacitance and the injected voltage from the DAC capacitance are not equal.

27. The ADC of claim 26, wherein the DAC capacitance comprises an array of multiple switched capacitances, the ADC further comprising a calibration logic module arranged to adjust the calibration capacitance based on how many of the multiple switched capacitances of the DAC capacitance are switched to the reference voltage.

28. The ADC of claim 26, wherein the calibration capacitance is adjustable to match the DAC capacitance.

29. The ADC of claim 26, wherein the reference voltage is external to the ADC.

* * * * *